United States Patent
Oobuchi et al.

(10) Patent No.: US 7,727,920 B2
(45) Date of Patent: Jun. 1, 2010

(54) PROCESS FOR PRODUCTION OF CERAMIC PORCELAINS, CERAMIC PROCELAINS AND ELECTRONIC COMPONENTS

(75) Inventors: Takeshi Oobuchi, Saku (JP); Tadashi Otagiri, Nagoya (JP); Yoshinori Ide, Minami-Saku Gun (JP)

(73) Assignees: NGK Insulators, Ltd., Nagoya (JP); Soshin Electric Co., Ltd., Saku-Shi (JP)

( * ) Notice: Subject to any disclaimer, the term of this patent is extended or adjusted under 35 U.S.C. 154(b) by 0 days.

(21) Appl. No.: 12/283,125

(22) Filed: Sep. 9, 2008

(65) Prior Publication Data
US 2009/0048089 A1 Feb. 19, 2009

Related U.S. Application Data

(63) Continuation of application No. PCT/JP2007/055783, filed on Mar. 14, 2007.

(30) Foreign Application Priority Data
Mar. 31, 2006 (JP) .............................. 2006-096570

(51) Int. Cl.
*C04B 35/03* (2006.01)
*C04B 35/00* (2006.01)
*C04B 33/24* (2006.01)
*C04B 14/00* (2006.01)
*B32B 18/00* (2006.01)

(52) U.S. Cl. .................. 501/125; 501/128; 501/143; 501/153; 428/325; 106/631

(58) Field of Classification Search ................ 501/123, 501/125, 127, 128, 141, 153, 143; 428/210, 428/325; 106/631
See application file for complete search history.

(56) References Cited

U.S. PATENT DOCUMENTS 4,018,614 A * 4/1977 Nordlie ....................... 501/104

(Continued)

FOREIGN PATENT DOCUMENTS

JP 2000-211969 A1 8/2000

(Continued)

OTHER PUBLICATIONS

Hwang et al. Silicon nitride ceramics with celsian as and additive. Journal of Materials Science 31 (1996) p. 150-156.*

(Continued)

*Primary Examiner*—Karl E Group
*Assistant Examiner*—Noah S Wiese
(74) *Attorney, Agent, or Firm*—Burr & Brown

(57) ABSTRACT

0.5 to 30 parts by weight of a hexagonal celsian powder is added to 100 parts by weight of a ceramic raw material powder to give a mixture. The mixture is sintered to give a ceramic porcelain so as to precipitate monoclinic celsian in the ceramic porcelain.

5 Claims, 7 Drawing Sheets

U.S. PATENT DOCUMENTS

| | | | |
|---|---|---|---|
| 5,358,912 A * | 10/1994 | Freitag et al. | 501/97.2 |
| 5,578,534 A * | 11/1996 | Talmy et al. | 501/32 |
| 6,379,805 B1 | 4/2002 | Oobuchi et al. | |
| 6,893,728 B2 | 5/2005 | Oobuchi | |
| 2002/0039645 A1* | 4/2002 | Kawai et al. | 428/210 |
| 2002/0094929 A1* | 7/2002 | Kawai et al. | 501/32 |
| 2003/0171202 A1* | 9/2003 | Oobuchi | 501/8 |
| 2006/0052231 A1* | 3/2006 | Ito et al. | 501/77 |

FOREIGN PATENT DOCUMENTS

| | | |
|---|---|---|
| JP | 2003-012370 A1 | 1/2003 |
| JP | 2003-040668 A1 | 2/2003 |
| JP | 2004-339049 A1 | 12/2004 |
| JP | 2005-306714 A1 | 11/2005 |

OTHER PUBLICATIONS

U.S. Appl. No. 12/204,006, filed Sep. 4, 2008, Hasegawa et al.

* cited by examiner

Fig. 5
(a)
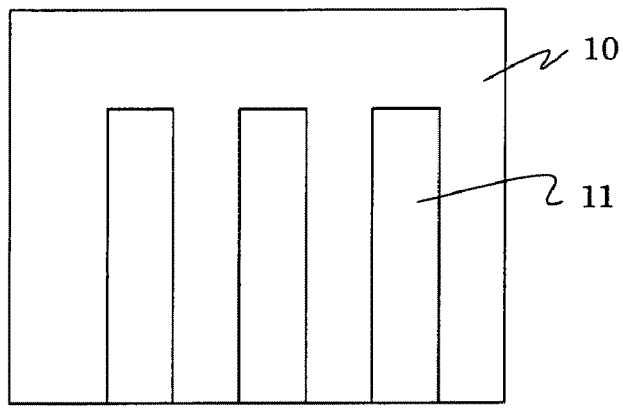
(b)
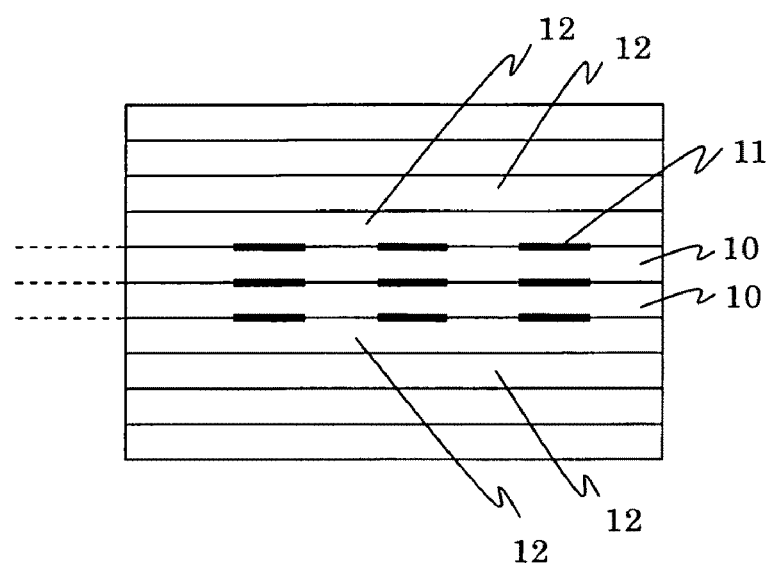

PROCESS FOR PRODUCTION OF CERAMIC PORCELAINS, CERAMIC PROCELAINS AND ELECTRONIC COMPONENTS

FIELD OF THE INVENTION

The present invention relates to a method for producing a ceramic porcelain and to an electronic part.

BACKGROUND ART

In high-frequency circuit radio communication devices such as cellular phones, laminated dielectric filters have been used as high-frequency circuit filters such as top filters, interstage filters for transmission, local filters, and interstage filters for reception. In the production of each laminated dielectric filter, plural molded bodies, of which a dielectric body is made, are formed with a ceramic powder, and a predetermined conductive paste is applied to each molded body to form a predetermined electrode pattern on the molded body. Then the molded bodies are laminated each other to give a laminate, and by firing the laminate, the conductive paste layer and the molded bodies are fired together, whereby the laminate is densified.

In the above step, the electrode is generally formed of a low-melting metallic conductor such as a silver-based, copper-based, or nickel-based conductor. Since the melting point of such conductor is below 1100° C., for example, and sometimes as low as about 930° C., it is necessary to sinter the dielectric body at a firing temperature lower than the melting point of the low-melting metal of which the electrode is formed.

To reduce stray capacitance, delay time and high-frequency losses of a built-in resonator and a capacitor, it is desired that the dielectric constant ∈r of low-temperature fired porcelain be lowered and the quality factor Q be increased. The present applicant has disclosed, in Japanese Patent Application Laid-Open No. 2000-211969A, a low-temperature fired porcelain having an optimum firing temperature of below 1000° C., a dielectric constant ∈r of below 10, and a quality factor Q of above 2500. This porcelain is mainly made of silica, alumina, and barium oxide, in which high-strength celsian phases are precipitated.

Furthermore, in Japanese Patent Application Laid-Open No. 2003-12370A, by precipitating sanbornite, celsian, and cristobalite phases, the firing shrinkage of a porcelain during firing is controlled and crack occurrence within the porcelain is prevented.

Also, Japanese Patent Application Laid-Open No. 2003-40668A discloses a low-temperature fired porcelain in which garnite, spinel, needle-shaped celsian crystalline phases and the like are precipitated and which has high strength, high thermal conductivity, and high Young's modulus.

However, as electronic parts are increased in frequency and decreased in size, there is an increasing demand to further enhance the fracture toughness of ceramic porcelains. In such ceramic porcelains as well, there is still an upper limit to the enhancement of the fracture toughness thereof, and thus there is a growing demand to implement the further enhancement of the fracture toughness thereof while maintaining other characteristics.

SUMMARY OF THE INVENTION

An object of the present invention is to further enhance the fracture toughness of a ceramic porcelain.

A method for producing a ceramic porcelain according to the present invention comprises the steps of:
adding 0.5 to 30 parts by weight of a hexagonal celsian powder to 100 parts by weight of a ceramic powder to give a mixture; and
sintering the mixture to give a ceramic porcelain so as to precipitate monoclinic celsian in the ceramic porcelain.

Further, the present invention relates to a ceramic porcelain obtained by the above production method.

Furthermore, the present invention relates to an electronic part, at least a part of which is made of the porcelain.

In the foregoing porcelains in conventional art as well, celsian crystalline phases are precipitated within the structure of the porcelains, and thus it can be seen that the strength of the porcelains increase to some extent. However, those celsian phases are not produced by adding a celsian material, but produced by each combining a specific composition and a production method.

The present inventors examined the addition of hexagonal celsian in producing a ceramic porcelain. In particular, for example, as schematically shown in FIG. 1, they attempted to calcine a material of main phase for purification, and at a step of mixing a rough-pulverized, low-melting glass with the material, add a hexagonal celsian powder, stir the mixture, and then sinter it.

As a result, it has been found that by adding the hexagonal celsian before sintering, monoclinic celsian having needle-shaped crystals is precipitated, in addition to $BaZn_2Ti_4O_{11}$, $TiZn_2O_4$, $TiO_2$ (rutile), and the low-melting glass. Since the needle-shaped celsian crystals can prevent the development of cracks, the fracture toughness value increases. That is, as schematically shown in FIG. 2, the development of the cracks within the structure of the porcelain requires the removal of the needle-shaped crystals, and therefore, the development of the cracks can be suppressed by energy required for the removal.

However, the enhanced fracture toughness of the porcelain obtained by the production method according to the present invention is considerably higher than the enhanced fracture toughness of the conventional porcelains in which celsian crystalline phase is precipitated. By investigating the reason of the above fact, the following have been found: as schematically shown in FIG. 3(a), in a case where needle-shaped celsian crystals 5 are added to raw material powders 4, there is a tendency for the needle-shaped crystals 5 to be present between the other crystalline powders 4 as a kind of thorn to prevent the progress of the sintering of the other powders 4; as shown in FIG. 3(b), since the sinterability of the powder decreases in such a manner, there is a tendency that the sintering of crystalline powders 1 is partially prevented and that the length of celsian crystalline powders 6 is shorten, even if the needle-shaped celsian crystalline powders 5 are added; and since unsintered portions tend to be left, there is a tendency for the fracture toughness value to decrease. And further, it is considered that the needle-shaped celsian crystals tend to break at the step of sintering and thus the crystals 6 with an aspect ratio not higher than 3 are left in the porcelain.

On the other hand, as schematically shown in FIG. 4(a), in the case where hexagonal celsian crystalline powders 7 are added to porcelain materials 4 before sintering and then the mixture is sintered, the powders 7 tend to be held between the grain boundaries of the raw material powders 4 larger than the other powders in quantity, and therefore, the sintering of the other ceramic powders 4 is not prevented. And furthermore, as schematically shown in FIG. 4(b), it is considered that the powders 7 are changed into needle-shaped monoclinic crystals 2 with the progress of the sintering of the porcelain comprised of the crystalline powders 4, and during this step, the monoclinic crystals 2 are rearranged along elongated grain boundaries between the other crystalline phases 1 so that the grain boundaries are closely filled therewith. Consequently, it is considered that since no insufficiently sintered portion is left, a form is created in which the monoclinic celsian crystalline phases 2 tend to exert their strength to the maximum.

BRIEF DESCRIPTION OF THE DRAWINGS

FIG. 5(a) is a plan view showing a resonator pattern on the green sheet of a device produced in an example, and FIG. 5(b) is a schematic cross-sectional view of the device.

DETAILED DESCRIPTION OF THE INVENTION

Figure 1:
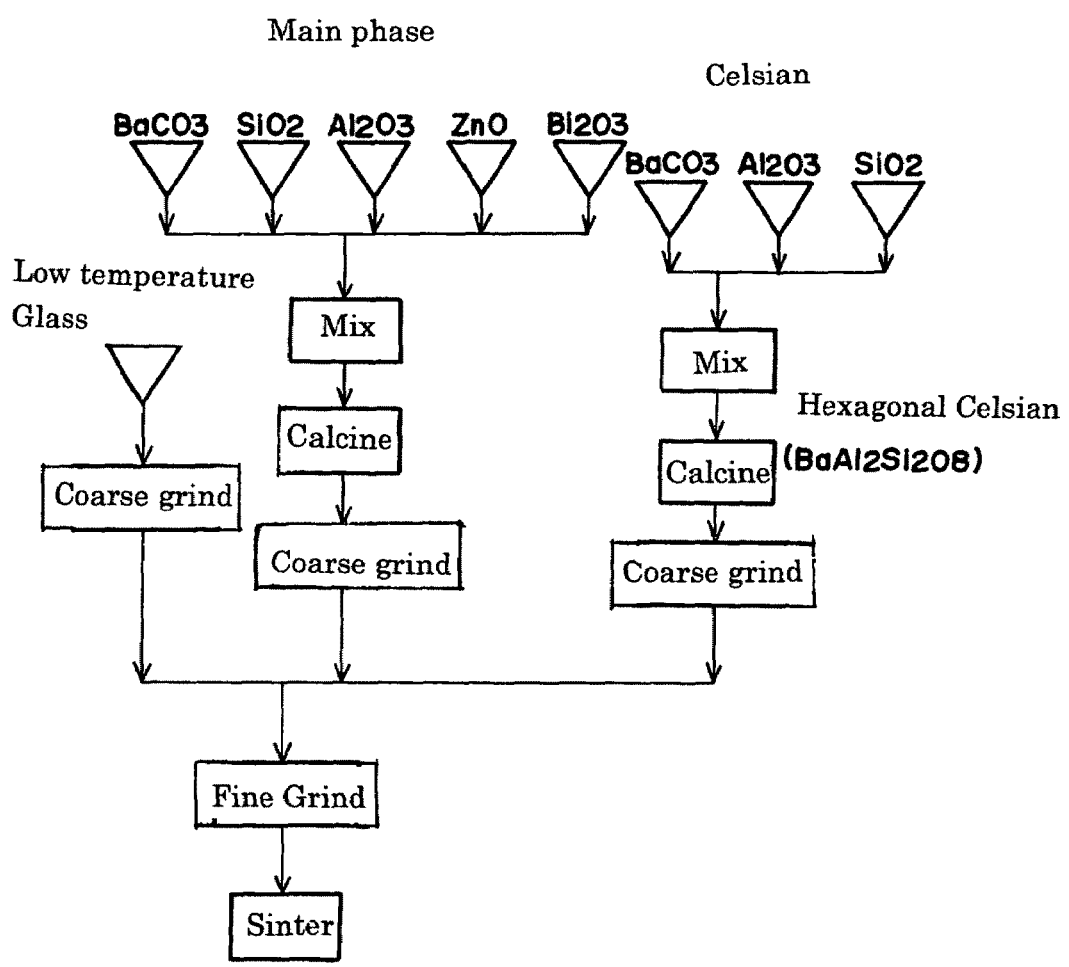
FIG. 1 is a flowchart of a production method according to embodiments of the present invention.
Figure 2:
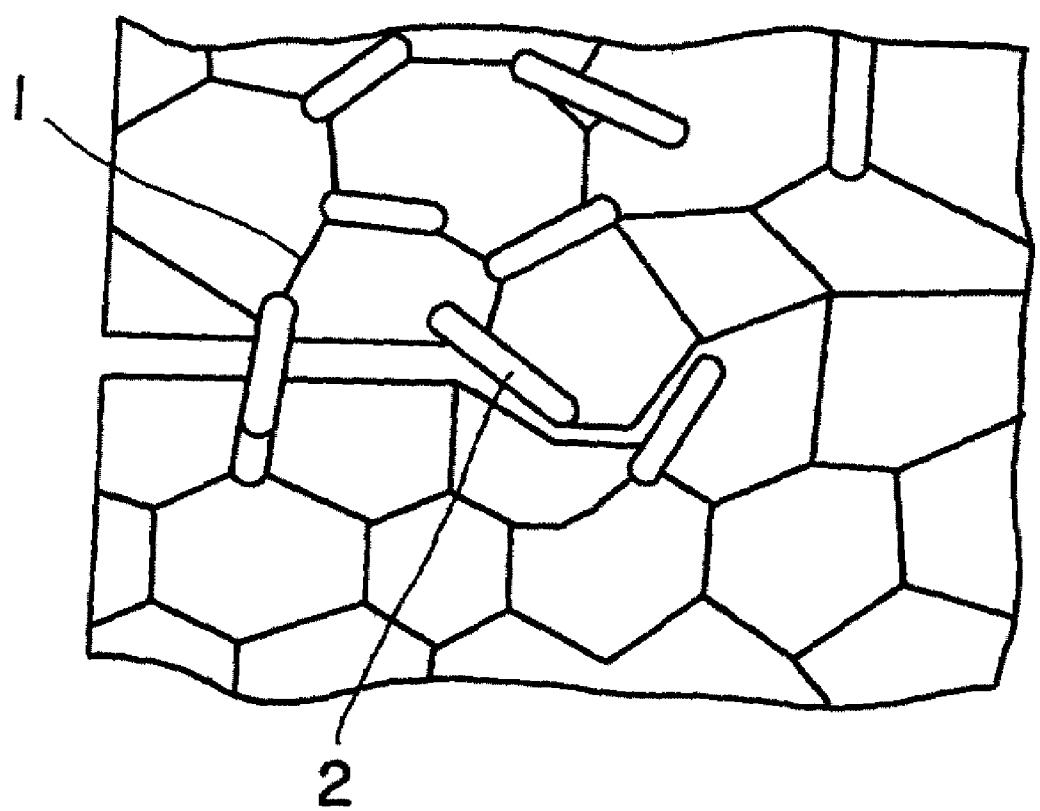
FIG. 2 shows a microstructure of a porcelain obtained according to the present invention.
Figure 3:
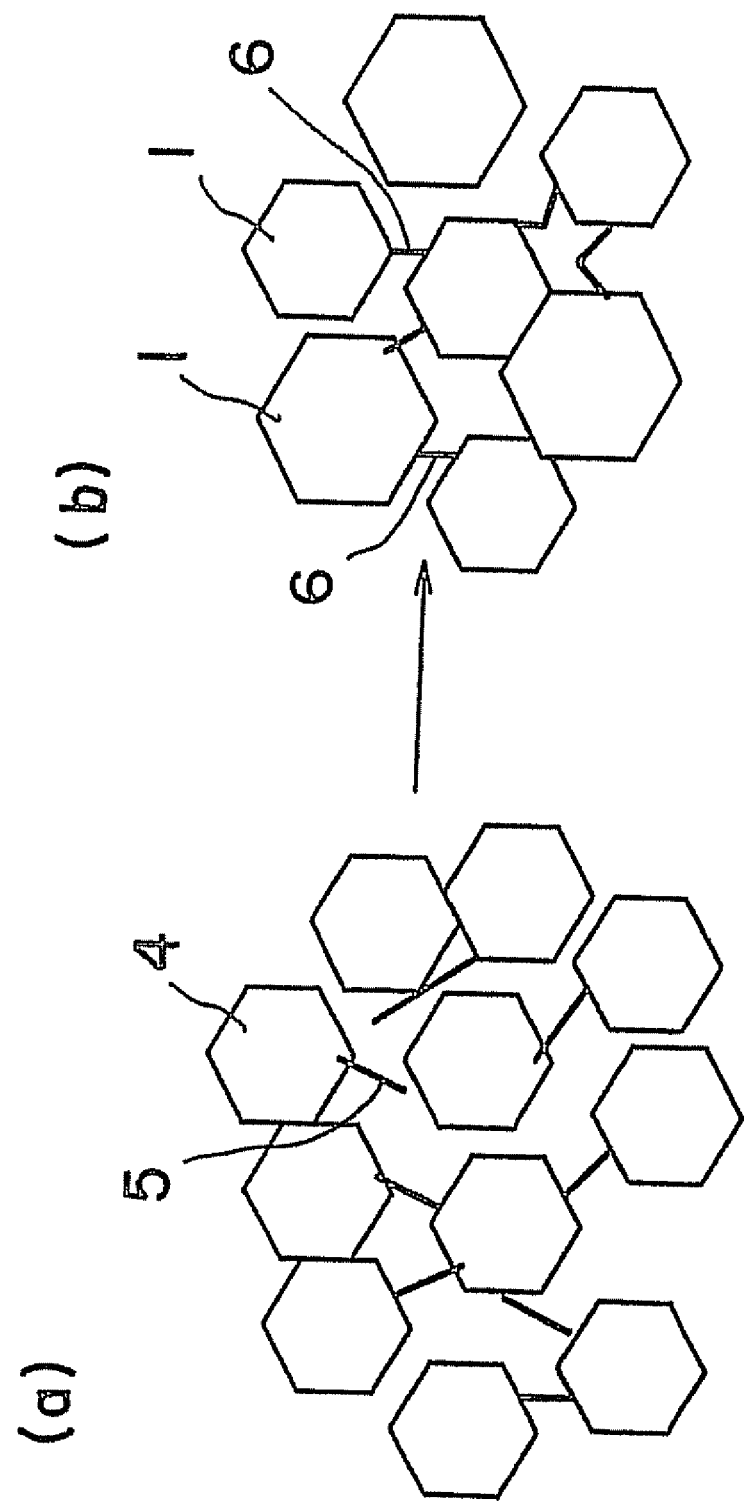
FIG. 3(a) is a schematic view showing a raw material mixture before sintering in a comparative example.
FIG. 3(b) is a schematic view showing a state of the mixture of FIG. 3(a) after sintering.
Figure 4:
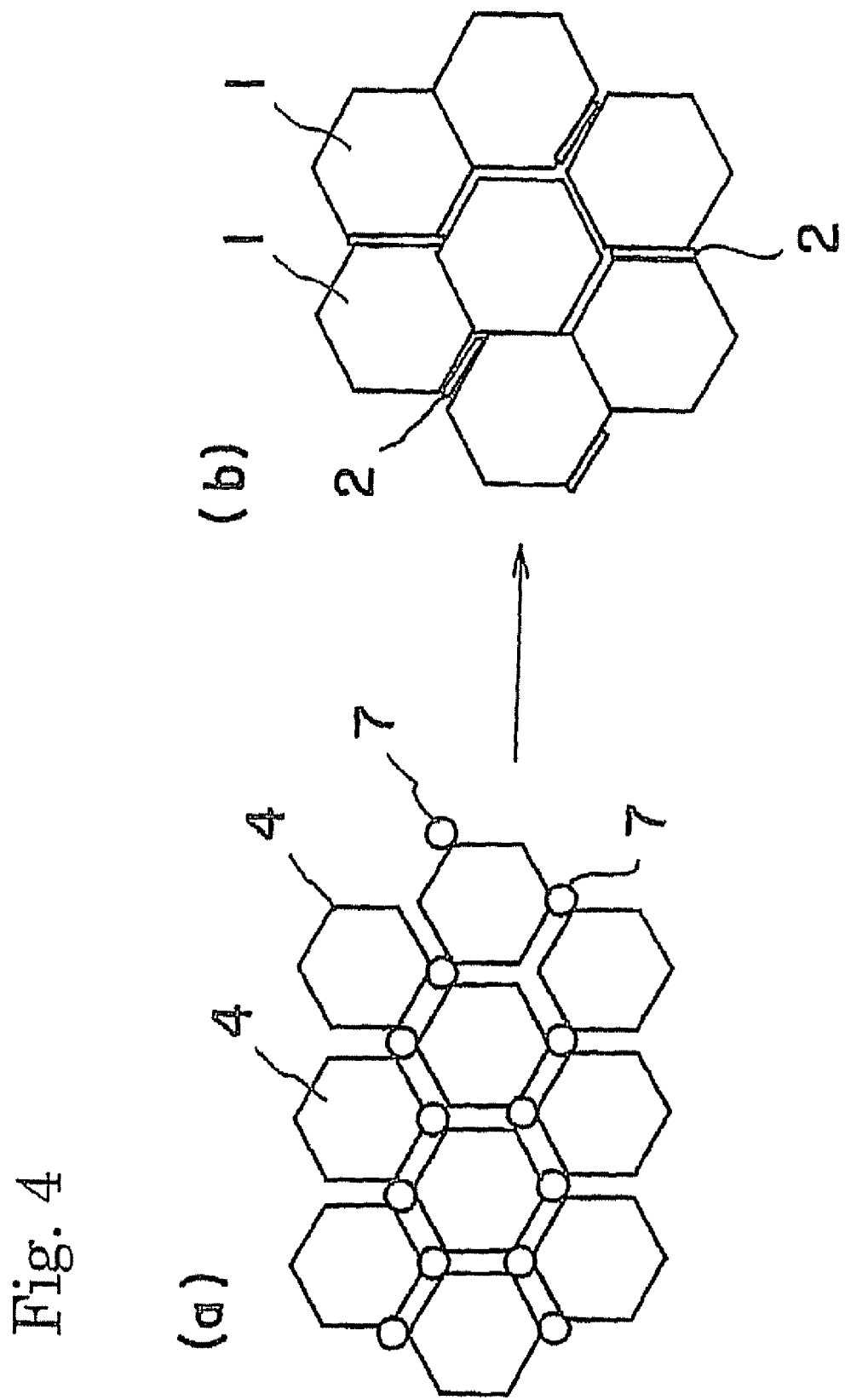
FIG. 4(a) is a schematic view showing a raw material mixture before sintering in the present invention.
FIG. 4(b) is a schematic view showing a state of the mixture of FIG. 4(a) after sintering.

A method for producing a ceramic porcelain according to the present invention includes steps of:

adding 0.5 to 30 weight % of a hexagonal celsian powder to a ceramic powder to give a mixture; and precipitating needle-shaped monoclinic celsian within the ceramic porcelain in sintering the mixture to give a ceramic porcelain.

The kind of the porcelain and that of the ceramic powder are not particularly limited, but the porcelain can be exemplified by the following composition systems:

$BaO-TiO_2$, $BaO-RE_2O_3-TiO_2$ (RE represents a lanthanoid), $BaO-RE_2O_3-Bi_2O_3-TiO_2$ (RE represents a lanthanoid), or $MgO-CaO-TiO_2$.

In a preferred embodiment, a ceramic raw material powder has a ceramic composition comprised of BaO: 9.0 to 26.0 weight %, $TiO_2$: 30.0 to 75.0 weight %, and ZnO: 0.1 to 38.0 weight %. In a barium (zinc) titanate-based porcelain made of such raw material powder, it has been found that a porcelain in which monoclinic celsian is precipitated has particularly excellent fracture toughness.

In a further preferred embodiment, when the total amount of BaO, $TiO_2$ and ZnO in the ceramic raw material powder is set at 100 parts by weight, the ceramic raw material powder further contains $Al_2O_3$: 0.7 to 15.0 parts by weight, $SiO_2$: 0.1 to 15.0 parts by weight, MnO: 0.1 to 5.5 parts by weight and $B_2O_3$: 0.1 to 20.0 parts by weight.

The celsian crystal phases are hexagonal at a high-temperature phase and monoclinic at a low-temperature phase. Therefore, it can be also estimated that when a glass powder is added to the hexagonal celsian in addition to the main phase of the porcelain material and then the mixture is sintered at a relatively low temperature, the low-temperature phase monoclinic crystals are easily precipitated.

Furthermore, in addition to the porcelain material powder and the hexagonal celsian powder, it is preferable to add a glass powder. In this case, the glass powder can be exemplified by the following compositions: $ZnO-SiO_2-B_2O_3$, $SiO_2-B_2O_3$, $BaO-Al_2O_3-SiO_2-B_2O_3$, $BaO-Bi_2O_3-B_2O_3$, $Li_2O-R_2O_3-SiO_2-B_2O_3$, or $Li_2O-RO-SiO_2-B_2O_3$ (R represents an alkaline earth metal).

In the production method according to the present invention, 0.5 to 30 parts by weight of the hexagonal celsian powder is added to the ceramic powder. The weight ratio of the celsian powder is calculated based on the total amount of the raw material powder set at 100 parts by weight. In this case, by setting the ratio of the hexagonal celsian powder at not lower than 0.5 part by weight, the precipitation of the monoclinic celsian crystals in the porcelain can be promoted, whereby the fracture toughness of the porcelain can be further enhanced. From this point of view, it is more preferable that the amount of the hexagonal celsian powder to be added be not less than 2.0 parts by weight.

When the amount of the hexagonal celsian powder to be added exceeds 30 parts by weight, the sinterability decreases and the number of flaws in the porcelain increases. Therefore, the amount of the hexagonal celsian powder to be added is set at not more than 30 parts by weight. From this point of view, it is more preferable that the amount of the hexagonal celsian powder to be added be not more than 25 parts by weight.

The hexagonal celsian powder can be added to the mixture of metallic materials of which the porcelain is made; or it is possible to mix oxides other than the hexagonal celsian powder, calcine the mixture to produce a calcined body, pulverize the calcined body to give a calcined powder, add and mix the hexagonal celsian powder and the glass powder into the calcined powder, and then sinter the mixture.

At the time of addition of the celsian powder, an additive like the one generally used in producing porcelains can be further added. Such an additive can be exemplified by partially stabilized zirconia or alumina.

The length of the needle-shaped celsian crystal phases precipitated in the porcelain is not limited, and is generally 1.6 to 3.0 μm. Further, the diameter of the celsian crystal phases is generally 0.1 to 0.8 μm, and the aspect ratio is generally 2.0 to 30.

In the ceramic porcelain according to the present invention, by setting the amount of BaO at 9.0 to 26.0 weight %, the porosity of the porcelain is considerably decreased, the fracture toughness is enhanced, and the precipitation of a ferroelectric layer is suppressed.

By setting the amount of $TiO_2$ at 30.0 to 75.0 weight %, the porosity of the porcelain is considerably decreased, the fracture toughness is enhanced, and the occurrence of cracks is suppressed.

By setting the amount of ZnO at 0.1 to 38.0 weight %, the porosity of the porcelain is considerably decreased, its fracture toughness is enhanced, and the occurrence of cracks is suppressed.

Furthermore, in a preferred ceramic composition of the porcelain according to the present invention, the amount of $Al_2O_3$ can be set at 0.7 to 15.0 parts by weight. It should be noted that the total amount of BaO, $TiO_2$ and ZnO is set at 100 parts by weight. By adding $Al_2O_3$ at such a ratio, the sinterability of the porcelain can be controlled.

In another preferred ceramic composition of the porcelain according to the present invention, the amount of $SiO_2$ can be set at 0.1 to 15.0 weight %. It should be noted that the total amount of BaO, $TiO_2$ and ZnO is set at 100 parts by weight. By adding $SiO_2$ at such a ratio, the sinterability of the porcelain can be controlled.

In still another preferred ceramic composition of the porcelain according to the present invention, the amount of MnO can be set at 0.1 to 5.5 weight %. It should be noted that the total amount of BaO and ZnO is set at 100 parts by weight. By adding MnO at such a ratio, the sinterability of the porcelain can be controlled.

In still another preferred ceramic composition of the porcelain according to the present invention, the amount of $B_2O_3$ can be set at 0.1 to 20.0 weight %. It should be noted that the total amount of BaO, $TiO_2$ and ZnO is set at 100 parts by weight. By adding $B_2O_3$ at such a ratio, the sinterability of the porcelain can be controlled.

In the present invention, its X-ray diffraction chart is made and its peak intensities are measured under the following conditions.

Designation of X-Ray Diffractometer:
Trade Name "Multi Flex" from Rigaku Co., Ltd.

Vessel: Cu

Tube Voltage: 50 kV

Tube Current: 30 mA

Monochromator: Incidence-Side Ge Divergence Slit: ½ deg

Scattering Slit: ½ deg

Light-Receiving Slit: 0.15 mm

Step: 0.02 deg

Counting Time: 2.0 sec

In the porcelain according to the present invention, inevitable impurities in the metallic materials may be contained. Further, oxides and metal components other than the foregoing components may be contained therein. Examples of such oxides and metal components include MgO, CaO, SrO, $Y_2O_3$, $V_2O_3$, CoO, NiO, $Nd_2O_3$, $Sm_2O_3$, $La_2O_3$, CuO, Ag, Cu, Ni and Pd.

An electronic part which is the object of the present invention is not particularly limited, and can be exemplified by a laminated dielectric filter, a multilayer wiring board, a dielectric antenna, a dielectric coupler, or a dielectric composite module.

In the electronic part according to the present invention, the ceramic porcelain is preferably joined to an additional portion of the electronic part. The type of the additional portion is not limited; a dielectric layer, a magnetic layer, a piezoelectric layer, or a metal electrode is preferred.

The kind of the metal electrode usable in the electronic part is not limited; the electrode is preferably formed of silver, copper, nickel, any one of alloys of those metals, or any one of mixtures of those metals, more preferably formed of silver, silver alloy, or a mixture of silver and the other metal(s), and most preferably formed of silver.

On the metal electrode, a plated layer and/or a soldered layer can be provided. The component of the plated layer can be exemplified by Ni or Sn. The component(s) of the soldered layer can be exemplified by Sn—Pb, Sn—Pb—Ag, Sn—Pb—Sb, Sn—Pb—In—Sb—Ag, Sn—Pb—Ag—Cu, Sn—Zn—In, Sn—Ag, Sn—Ag—Bi—Cu, Sn—Ag—Cu, Sn—Cu, Sn—Sb—Ag—Cu, or Sn.

In the electronic part according to the present invention, the low-temperature fired porcelain according to the present invention can be combined with another low-temperature fired porcelain with a dielectric constant ∈r of 10 to 150.

The composition system of such porcelain is not limited; the followings are preferred:

BaO—$TiO_2$—ZnO—$SiO_2$—$B_2O_3$,

BaO—$TiO_2$—$Bi_2O_3$—$Nd_2O_3$—ZnO—$SiO_2$—$B_2O_3$,

BaO—$TiO_2$—$Bi_2O_3$—$La_2O_3$—$Sm_2O_3$—ZnO—$SiO_2$—$B_2O_3$, or

MgO—CaO—$TiO_2$—ZnO—$Al_2O_3$—$SiO_2$—$B_2O_3$.

A magnetic substance of which the magnetic layer is formed can be exemplified by the following:

MnO—ZnO—$Fe_2O_3$—CuO,

MnO—ZnO—$Fe_2O_3$—CuO—$SiO_2$,

MnO—ZnO—$Fe_2O_3$—CuO—$Ta_2O_5$,

MnO—ZnO—$Fe_2O_3$—CuO—$SiO_2$—$Ta_2O_5$,

NiO—ZnO—$Fe_2O_3$,

MnO—ZnO—$Fe_2O_3$,

MnO—ZnO—$Fe_2O_3$—$Bi_2O_3$—$MoO_3$, or

NiO—CuO—ZnO.

A piezoelectric substance of which the piezoelectric layer is formed can be exemplified by the following:

PbO—$ZrO_2$—$TiO_2$,

PbO—$ZrO_2$—$TiO_2$—$Sb_2O_3$, $K_2O$—$Na_2O$—$Li_2O$—$Nb_2O_3$—$Ta_2O_3$—$Bi_2O_3$,

PbO—CoO—$Nb_2O_3$—$ZrO_2$—$TiO_2$,

PbO—MgO—$Nb_2O_3$—$Yb_2O_3$—$TiO_2$—$ZrO_2$, or

BaO—$TiO_2$.

When producing the low temperature-fired porcelain according to the present invention, it is preferable to mix the materials for the metal components together at a predetermined mixing ratio to give a mixed powder, calcine the mixed powder at a temperature of 850 to 1200° C., and then pulverize the calcined body to give a ceramic powder. It is preferable to form a green sheet by using the ceramic powder, the low-melting glass powder, and the hexagonal celsian powder and then fire the green sheet at a temperature of 850 to 930° C. As the materials for the metal components, oxide, nitrate, carbonate, sulfate, etc. of each metal can be used.

EXAMPLES

Test Numbers 1 to 10

(Production of Ceramic Powder)

Barium carbonate, titanium oxide and zinc oxide powder were weighed so as to formulate predetermined compositions shown in Table 1. Then, alumina and manganese oxide powders were weighed by 0.5 part by weight and 0.8 part by weight respectively, and added. The powdery substances were each wet-mixed, following which the mixed powder was calcined at 1250° C. to give a calcined body. Thereafter, the calcined substance was subjected to powder X-ray diffraction analysis to evaluate the crystalline phase and crystallinity. As a result, it was found that the following crystalline phases developed:

$BaZn_{2.03}Ti_{3.93}O_{10.89}$ Phase (ICSD No. 81-2380), $TiZn_2O_4$ Phase (ICSD No. 77-0014), and $TiO_2$ (Rutile) Phase (ICSD No. 73-1765).

Then, each calcined powder was pulverized with a ball mill to a predetermined particle size, and the powder was dried to give a ceramic raw material powder.

(Production of Glass Powder)

$SiO_2$, ZnO and $B_2O_3$ powders were weighed and dry-mixed together. Then, the mixed powder was melted in a platinum crucible, and the melt was rapidly cooled by being immersed in water to give a massive glass. Thereafter, the glass was wet-pulverized to give a low-melting glass powder.

(Production of Hexagonal Celsian Powder)

Barium carbonate, alumina, and silicon oxide powders are wet-mixed in accordance with the composition ratio of celsian, and calcined at 1350° C. to give a hexagonal celsian calcined body. Then, the calcined body was roughly pulverized to give a calcined powder. The X-ray diffraction pattern of the resulting calcined powder corresponded to that of the hexagonal celsian (ICSD No. 38-1450).

(Sintering)

The above-described ceramic raw material powder, glass powder, and hexagonal celsian powder were finely pulverized together. An organic solvent, a binder, a plasticizer and a dispersant were mixed together and added to the finely-pulverized mixed powder. Then, the mixture was stirred using an alumina pot and alumina balls to give a slurry, following which the slurry was dried to give a granulated powder. The resulting granulated powder was molded with a press die into a predetermined shape, and the molded body was fired at 920° C., giving a sintered porcelain.

(Measurement of Open Porosity)

The open porosity of the resulting sintered body was measured by means of the Archimedes method.

(Measurement of X-Ray Diffraction Peaks)

The X-ray diffraction peaks of the individual porcelain test samples were measured under the foregoing conditions. Through the measurement, the crystalline phases shown below were recognized.

(Fracture Toughness)

The above ceramic powder, glass powder, and hexagonal celsian powder were wet-mixed together with an organic binder, a plasticizer, a dispersant and an organic solvent using an alumina pot and alumina balls to give a slurry for green-sheet formation. Through the use of such a slurry, green sheets of 0.03 to 2 mm in thickness were formed by using a doctor blade. A predetermined number of the green sheets were laminated together by means of the Cold Isostatic Pressing (CIP) method to give a laminate, and the laminate was cut into pieces 11×8×3 mm in dimensions by using a cutoff device, following which the individual laminates were fired at 920° C., giving sintered bodies. Then, the sintered bodies were washed, electroplated in a nickel solution, and electroplated in a stannum neutral solution, and thereafter, the resulting test samples were washed. The fracture toughness of each test sample was measured using the Indentation Fracture method (IF method: JIS-R-1607).

(Number of Crack Occurrence)

Green sheets of 0.03 to 2 mm in thickness were formed in the same manner as described above. As model patterns, resonator electrode patterns 11 of FIGS. 5(a) and 5(b) were screen-printed on the green sheets by using an Ag—Pt paste (Pt: 1 wt %). A predetermined number of the green sheets 10 and 12 were laminated together by means of the Cold Isostatic Pressing (CIP) method to give a laminate having a laminated structure of FIG. 5(b). The laminate was cut with a cutoff device such that each laminate had dimensions of 3.2×2.5× 1.8 mm after firing. After the print of external electrodes, the laminates were sintered at 920° C. The resulting sintered bodies were exposed to thermal shock and high humidity conditions mentioned below, and then the presence or absence of cracks was examined by means of ultrasonic flaw detection method. The determination of the presence or absence of cracks was made based on image data of ultrasonic echo reflection from crack portions by an ultrasonic flaw detector ("mi-scope" by Hitachi Construction Machinery). One thousand test samples were checked for cracks, and the numbers of defectives found are presented in Table 1.

(Thermal Shock Conditions)

A temperature range of −55 to +125° C. corresponds to 1 cycle, 1 cycle is completed in 1 hour, and the cycle is repeated 33 times.

(High Humidity Conditions)

Temperature: 85° C., Relative Humidity (RH): 85%, Time: 240 hours.

TABLE 1

| No. | BaO Wt. % | $TiO_2$ Wt. % | ZnO Wt. % | Celsian Added | Celsian Added ratio weight parts | $B_2O_3$ Content Weight Parts | Celsian Crystal phase After Sintering | Open Porosity (%) | Fracture Toughness | Occurrence Of crack In model pattern | paramagnetic material only or containing ferroelectric material |
|---|---|---|---|---|---|---|---|---|---|---|---|
| Com. Ex 1 | 20.0 | 60.0 | 20.0 | — | 0.0 | 0.6 | Monoclinic | 0.05 | 1.6 | 563/1000 | paramagnetic only |
| Ex. 2 | 20.0 | 60.0 | 20.0 | Hexagonal | 0.5 | 0.6 | Monoclinic | 0.04 | 3.2 | 12/1000 | paramagnetic only |
| Ex. 3 | 20.0 | 60.0 | 20.0 | Hexagonal | 2.0 | 0.6 | Monoclinic | 0.03 | 3.1 | 0/1000 | paramagnetic only |
| Ex. 4 | 20.0 | 60.0 | 20.0 | Hexagonal | 5.0 | 0.6 | Monoclinic | 0.04 | 3.2 | 0/1000 | paramagnetic only |
| Ex. 5 | 20.0 | 60.0 | 20.0 | Hexagonal | 10.0 | 0.6 | Monoclinic | 0.04 | 3.1 | 0/1000 | paramagnetic only |
| Ex. 6 | 20.0 | 60.0 | 20.0 | Hexagonal | 15.0 | 0.6 | Monoclinic | 0.05 | 3.2 | 0/1000 | paramagnetic only |
| Ex. 7 | 20.0 | 60.0 | 20.0 | Hexagonal | 20.0 | 0.6 | Monoclinic | 0.06 | 3.2 | 0/1000 | paramagnetic only |
| Ex. 8 | 20.0 | 60.0 | 20.0 | Hexagonal | 25.0 | 0.6 | Monoclinic | 0.08 | 3.2 | 0/1000 | paramagnetic only |
| Ex. 9 | 20.0 | 60.0 | 20.0 | Hexagonal | 30.0 | 0.6 | Monoclinic | 0.10 | 3.0 | 6/1000 | paramagnetic only |
| Com. Ex 10 | 20.0 | 60.0 | 20.0 | Hexagonal | 35.0 | 0.6 | Monoclinic | 1.10 | 1.8 | 580/1000 | paramagnetic only |

When the amount of the hexagonal celsian to be added is not more than 30 parts by weight, the rate of crack occurrence becomes high and fracture toughness value increases as well. When the amount of the hexagonal celsian to be added is within the range described in the present invention, fracture toughness value is high and few cracks occur.

When the above-described X-ray diffraction test was performed on the test samples according to the each example of test numbers 2 to 9, the following crystalline phases were recognized:

$BaZn_2Ti_4O_{11}$ Phase (ICSD No. 81-2380), $TiZn_2O_4$ Phase (ICSD No. 77-0014), $TiO_2$ (Rutile) Phase (ICSD No. 73-1765), and Monoclinic Celsian Phase (ICSD No. 74-1677).

Figure 6:
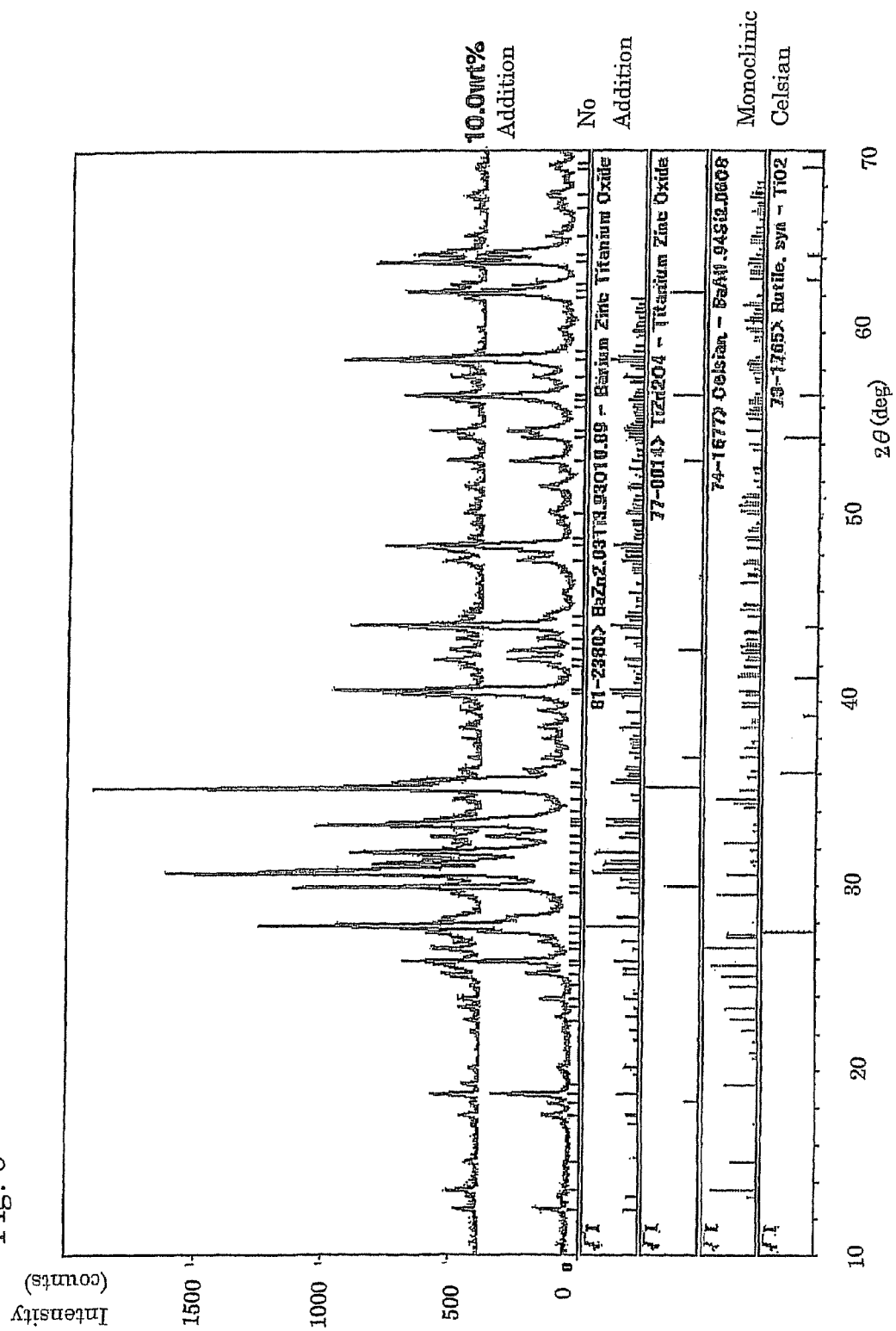
FIG. 6 is an X-ray diffraction chart of porcelains.

FIG. 6 shows X-ray diffraction charts of the porcelain in which the hexagonal celsian powder is not added and the porcelain in which the hexagonal celsian powder is added (by 10.0 parts by weight). In the porcelain obtained by adding the hexagonal celsian powder, the diffraction peaks of the monoclinic-phase celsian were recognized.

Figure 7:
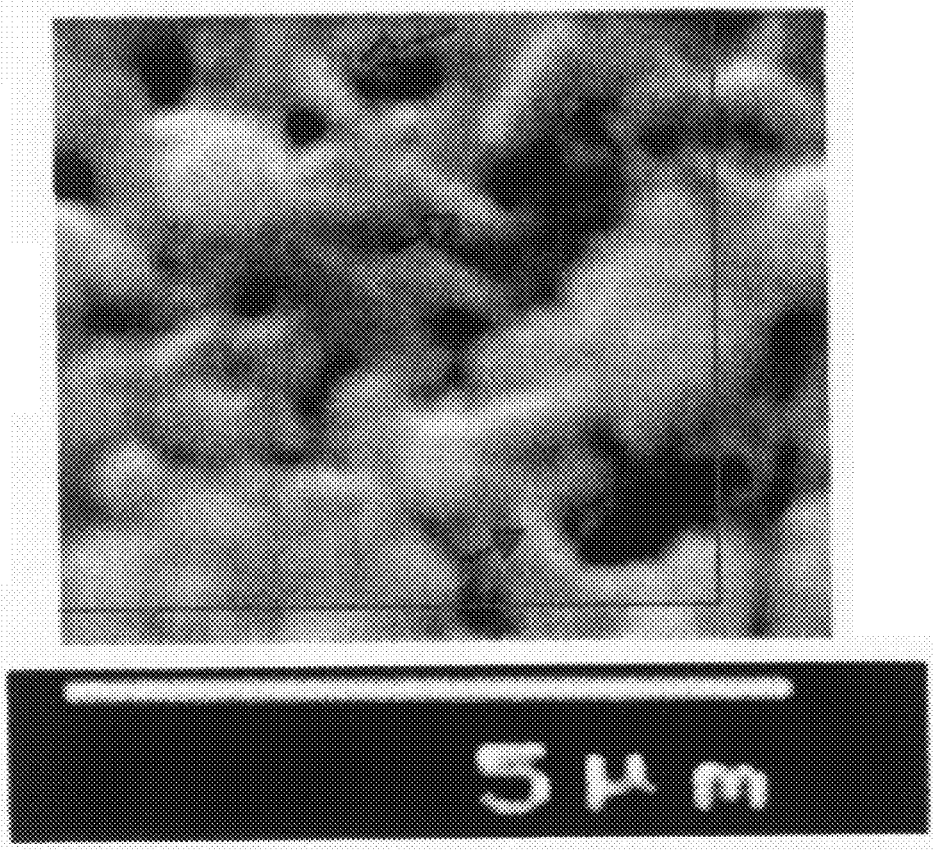
FIG. 7 is an electron microscope photograph of a porcelain according to the present invention.

FIG. 7 is a photograph of the porcelain in which the hexagonal celsian powder is added (by 10.0 parts by weight). This photograph shows that many needle-shaped crystalline phases are precipitated along grain boundaries. For example, when the four needle-shaped crystals were observed, the lengths, diameters, and aspect ratios thereof were as follows:

Length: 2.1 μm, Diameter: 0.4 μm, Aspect ratio: 5.3,

Length: 1.4 μm, Diameter: 0.4 μm, Aspect ratio: 3.5,

Length: 1.6 μm, Diameter: 0.4 μm, Aspect ratio: 4.0,

Length: 1.3 μm, Diameter: 0.4 μm, Aspect ratio: 3.3.

Test Numbers 11 to 18

Like the porcelains of test numbers 1 to 10, porcelains presented in Table 2 were produced. As a result, it was found that when not more than 30 parts by weight of the hexagonal celsian powder is added to the ceramic raw material powders and then monoclinic-phase celsian is precipitated in the porcelain, fracture toughness value is considerably increased and the occurrence of cracks is prevented. However, when the amount of barium oxide exceeds 30 parts by weight, a ferroelectric is formed in the porcelain.

TABLE 2

|  | No. | BaO Wt. % | $TiO_2$ Wt. % | ZnO Wt. % | Celsian Added | Celsian Added ratio weight parts | $B_2O_3$ Content Weight Parts | Celsian Crystal phase After Sintering | Open Porosity (%) | Fracture Toughness | Occurrence Of crack In model pattern | paramagnetic material only or containing ferroelectric material |
|---|---|---|---|---|---|---|---|---|---|---|---|---|
| Com. Ex | 11 | 0.0 | 50.0 | 50.0 | Hexagonal | 15.0 | 0.6 | None |  | 1.6 | 597/1000 | paramagnetic only |
| Ex. | 12 | 5.0 | 75.0 | 20.0 | Hexagonal | 15.0 | 0.6 | Monoclinic | 0.06% | 3.2 | 0/1000 | paramagnetic only |
| Ex. | 13 | 7.5 | 72.5 | 20.0 | Hexagonal | 15.0 | 0.6 | Monoclinic | 0.05% | 3.2 | 0/1000 | paramagnetic only |
| Ex. | 14 | 9.0 | 71.0 | 20.0 | Hexagonal | 15.0 | 0.6 | Monoclinic | 0.05% | 3.2 | 0/1000 | paramagnetic only |
| Ex. | 15 | 20.0 | 55.0 | 25.0 | Hexagonal | 15.0 | 0.6 | Monoclinic | 0.04% | 3.2 | 0/1000 | paramagnetic only |
| Ex. | 16 | 25.0 | 55.0 | 20.0 | Hexagonal | 15.0 | 0.6 | Monoclinic | 0.04% | 3.2 | 0/1000 | paramagnetic only |
| Ex. | 17 | 30.0 | 55.0 | 15.0 | Hexagonal | 15.0 | 0.6 | Monoclinic | 0.06% | 3.2 | 0/1000 | paramagnetic only |
| Com. Ex | 18 | 35.0 | 45.0 | 20.0 | Hexagonal | 15.0 | 0.6 | Monoclinic | 0.09% | 3.1 | 0/1000 | Containing Ferroelectric |

Test Numbers 19 to 28

Like the porcelains of test numbers 1 to 10, porcelains presented in Table 3 were produced. As a result, it was found that when not more than 30 parts by weight of the hexagonal celsian powder is added to the ceramic raw material powders and then monoclinic-phase celsian is precipitated in the porcelain, fracture toughness value is considerably increased and the occurrence of cracks is prevented.

TABLE 3

|  | No. | BaO Wt. % | $TiO_2$ Wt. % | ZnO Wt. % | Celsian Added | Celsian Added ratio Weight parts | $B_2O_3$ Content Weight Parts | Celsian Crystal phase After Sintering | Open Porosity (%) | Fracture Toughness | Occurrence Of crack In model pattern | paramagnetic material only or containing ferroelectric material |
|---|---|---|---|---|---|---|---|---|---|---|---|---|
| Com. Ex | 19 | 30.0 | 0.0 | 70.0 | Hexagonal | 15.0 | 0.6 | Monoclinic | 3.70% | 1.6 | 621/1000 | containing ferroelectric |
| Ex. | 20 | 25.0 | 7.5 | 67.5 | Hexagonal | 15.0 | 0.6 | Monoclinic | 0.10% | 3.0 | 0/1000 | paramagnetic only |
| Ex. | 21 | 25.0 | 12.5 | 62.5 | Hexagonal | 15.0 | 0.6 | Monoclinic | 0.06% | 3.2 | 0/1000 | paramagnetic only |
| Ex. | 22 | 25.0 | 15.0 | 60.0 | Hexagonal | 15.0 | 0.6 | Monoclinic | 0.05% | 3.2 | 0/1000 | paramagnetic only |
| Ex. | 23 | 25.0 | 20.0 | 55.0 | Hexagonal | 15.0 | 0.6 | Monoclinic | 0.05% | 3.2 | 0/1000 | paramagnetic only |
| Ex. | 24 | 20.0 | 40.0 | 40.0 | Hexagonal | 15.0 | 0.6 | Monoclinic | 0.06% | 3.2 | 0/1000 | paramagnetic only |
| Ex. | 25 | 25.0 | 60.0 | 15.0 | Hexagonal | 15.0 | 0.6 | Monoclinic | 0.05% | 3.2 | 0/1000 | paramagnetic only |
| Ex. | 26 | 15.0 | 70.0 | 15.0 | Hexagonal | 15.0 | 0.6 | Monoclinic | 0.06% | 3.2 | 0/1000 | paramagnetic only |
| Ex. | 27 | 15.0 | 80.0 | 5.0 | Hexagonal | 15.0 | 0.6 | Monoclinic | 0.12% | 2.9 | 0/1000 | paramagnetic only |
| Ex. | 28 | 7.5 | 90.0 | 2.5 | Hexagonal | 15.0 | 0.6 | Monoclinic | 0.15% | 2.7 | 0/1000 | paramagnetic only |

Test Numbers 29 to 37

Like the porcelains of test numbers 1 to 10, porcelains presented in Table 4 were produced. As a result, it was found that when not more than 30 parts by weight of the hexagonal celsian powder is added to the ceramic raw material powders and then monoclinic-phase celsian is precipitated in the porcelain, fracture toughness value is considerably increased and the occurrence of cracks is prevented.

TABLE 4

|  | No. | BaO Wt. % | $TiO_2$ Wt. % | ZnO Wt. % | Celsian Added | Celsian Added ratio Weight parts | $B_2O_3$ Content Weight Parts | Celsian Crystal phase After Sintering | Open Porosity (%) | Fracture Toughness | Occurrence Of crack In model pattern | paramagnetic material only or containing ferroelectric material |
|---|---|---|---|---|---|---|---|---|---|---|---|---|
| Ex | 29 | 20.0 | 80.0 | 0.0 | Hexagonal | 15.0 | 0.6 | Monoclinic | 0.06% | 3.2 | 0/1000 | paramagnetic only |
| Ex. | 30 | 45.0 | 40.0 | 15.0 | Hexagonal | 15.0 | 0.6 | Monoclinic | 0.05% | 3.2 | 0/1000 | paramagnetic only |
| Ex. | 31 | 30.0 | 50.0 | 20.0 | Hexagonal | 15.0 | 0.6 | Monoclinic | 0.05% | 3.2 | 0/1000 | paramagnetic only |
| Ex. | 32 | 35.0 | 50.0 | 25.0 | Hexagonal | 15.0 | 0.6 | Monoclinic | 0.04% | 3.2 | 0/1000 | paramagnetic only |
| Ex. | 33 | 22.5 | 27.5 | 40.0 | Hexagonal | 15.0 | 0.6 | Monoclinic | 0.04% | 3.2 | 0/1000 | paramagnetic only |
| Ex. | 34 | 17.5 | 22.5 | 50.0 | Hexagonal | 15.0 | 0.6 | Monoclinic | 0.04% | 3.2 | 0/1000 | paramagnetic only |
| Ex. | 35 | 17.5 | 12.5 | 60.0 | Hexagonal | 15.0 | 0.6 | Monoclinic | 0.05% | 3.2 | 0/1000 | paramagnetic only |
| Ex. | 36 | 12.5 | 12.5 | 70.0 | Hexagonal | 15.0 | 0.6 | Monoclinic | 0.04% | 3.2 | 0/1000 | paramagnetic only |
| Ex. | 37 | 7.5 | 12.5 | 80.0 | Hexagonal | 15.0 | 0.6 | Monoclinic | 0.14% | 3.2 | 0/1000 | paramagnetic only |

Test Numbers 38 to 45

Like the porcelains of test numbers 1 to 10, porcelains presented in Table 5 were produced. As a result, it was found that when not more than 30 parts by weight of the hexagonal celsian powder is added to the ceramic raw material powders and then monoclinic-phase celsian is precipitated in the porcelain, fracture toughness value is considerably increased and the occurrence of cracks is prevented.

Although the specific embodiments of the present invention have been described above, the present invention is not limited to these embodiments, and can be implemented with various modifications and alterations without departing from the scope of the appended claims.

TABLE 5

|  | No. | BaO Wt. % | $TiO_2$ Wt. % | ZnO Wt. % | Celsian Added | Celsian Added ratio Weight parts | $B_2O_3$ Content Weight Parts | Celsian Crystal phase After Sintering | Open Porosity (%) | Fracture Toughness | Occurrence Of crack In model pattern | paramagnetic material only or containing ferroelectric material |
|---|---|---|---|---|---|---|---|---|---|---|---|---|
| Ex | 38 | 20.0 | 60.0 | 20.0 | Hexagonal | 15.0 | 0.1 | Monoclinic | 0.19% | 3.0 | 0/1000 | paramagnetic only |
| Ex. | 39 | 20.0 | 60.0 | 20.0 | Hexagonal | 15.0 | 0.3 | Monoclinic | 0.05% | 3.2 | 0/1000 | paramagnetic only |
| Ex. | 40 | 20.0 | 60.0 | 20.0 | Hexagonal | 15.0 | 1.0 | Monoclinic | 0.06% | 3.2 | 0/1000 | paramagnetic only |
| Ex. | 41 | 20.0 | 60.0 | 20.0 | Hexagonal | 15.0 | 3.0 | Monoclinic | 0.02% | 3.2 | 0/1000 | paramagnetic only |
| Ex. | 42 | 20.0 | 60.0 | 20.0 | Hexagonal | 15.0 | 5.0 | Monoclinic | 0.02% | 3.2 | 0/1000 | paramagnetic only |
| Ex. | 43 | 20.0 | 60.0 | 20.0 | Hexagonal | 15.0 | 7.0 | Monoclinic | 0.01% | 3.2 | 0/1000 | paramagnetic only |
| Ex. | 44 | 20.0 | 60.0 | 20.0 | Hexagonal | 15.0 | 7.5 | Monoclinic | 0.02% | 3.2 | 0/1000 | paramagnetic only |
| Ex. | 45 | 20.0 | 60.0 | 20.0 | Hexagonal | 15.0 | 8.0 | Monoclinic | 0.02% | 3.2 | 0/1000 | paramagnetic only |

The invention claimed is:

1. A method of producing a ceramic porcelain, the method comprising the steps of:
    adding 0.5 to 30 parts by weight of a hexagonal celsian powder to 100 parts by weight of a ceramic raw material powder to give a mixture; and
    sintering the mixture to give a ceramic porcelain so as to precipitate monoclinic celsian in the ceramic porcelain.

2. The method of producing a ceramic porcelain of claim 1, wherein a glass powder is added to the mixture.

3. The method of producing a ceramic porcelain of claim 1, wherein the sintering is performed at a temperature of 850 to 1100° C.

4. The method of producing a ceramic porcelain of claim 1, wherein the ceramic raw material powder has a ceramic composition comprised of BaO: 9.0 to 26.0 weight %, $TiO_2$: 30.0 to 75.0 weight % and ZnO: 0.1 to 38.0 weight %.

5. The method of producing a ceramic porcelain of claim 4, wherein the ceramic raw material powder further contains $Al_2O_3$: 0.7 to 15.0 parts by weight, $SiO_2$: 0.1 to 15.0 parts by weight, MnO: 0.1 to 5.5 parts by weight and $B_2O_3$: 0.1 to 20.0 parts by weight, provided that the total amount of BaO, $TiO_2$ and ZnO in the ceramic raw material powder is set at 100 parts by weight.

\* \* \* \* \*